(12) United States Patent
Watanabe et al.

(10) Patent No.: US 8,580,131 B2
(45) Date of Patent: Nov. 12, 2013

(54) PLASMA ETCHING METHOD

(75) Inventors: Tomoyuki Watanabe, Kudamatsu (JP); Mamoru Yakushiji, Shunan (JP); Michikazu Morimoto, Kudamatsu (JP); Tetsuo Ono, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 105 days.

(21) Appl. No.: 13/363,488

(22) Filed: Feb. 1, 2012

(65) Prior Publication Data
US 2013/0109184 A1 May 2, 2013

(30) Foreign Application Priority Data

Oct. 31, 2011 (JP) ................................. 2011-238166

(51) Int. Cl.
- *B44C 1/22* (2006.01)
- *C23F 1/00* (2006.01)
- *C03C 15/00* (2006.01)
- *C03C 25/68* (2006.01)

(52) U.S. Cl.
USPC .............................. 216/72; 216/79; 438/724

(58) Field of Classification Search
USPC ....................... 216/72, 79; 438/724
See application file for complete search history.

(56) References Cited

U.S. PATENT DOCUMENTS

| 4,793,897 A * | 12/1988 | Dunfield et al. ............... 438/724 |
| 2007/0082483 A1 | 4/2007 | Bai |

FOREIGN PATENT DOCUMENTS

| JP | 10-303187 | 11/1998 |
| KR | 10-0780944 | 12/2007 |

OTHER PUBLICATIONS

Korean Official Action dated Jan. 29, 2013, for KR Application No. 10-2012-0005205.
Espacenet English abstract of US 2007/0082483.

* cited by examiner

*Primary Examiner* — Roberts Culbert
(74) *Attorney, Agent, or Firm* — Antonelli, Terry, Stout & Kraus, LLP.

(57) ABSTRACT

It is an object of the present invention to provide a plasma etching method that can improve a selection ratio of a film to be etched to a film different from the film to be etched than that in the related art. The present invention provides a plasma etching method for selectively etching a film to be etched with respect to another film different from the film to be etched, the plasma etching method including etching, using gas that can generate a deposited film containing components same as components of the another film different from the film to be etched, the film on which generation of the deposited film is suppressed.

4 Claims, 4 Drawing Sheets

FIG. 4A
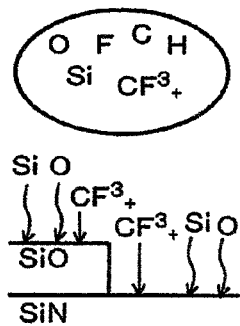
FIG. 4B
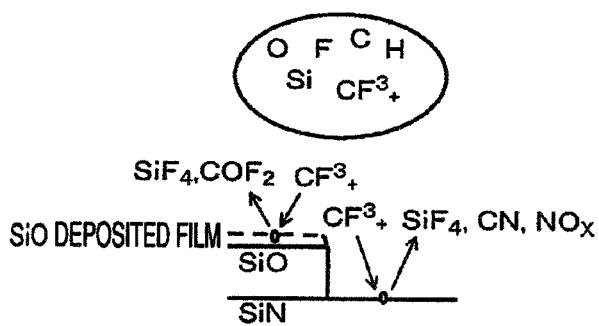
FIG. 4C
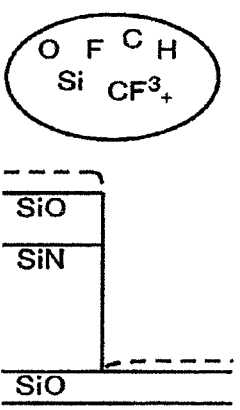
FIG. 4D
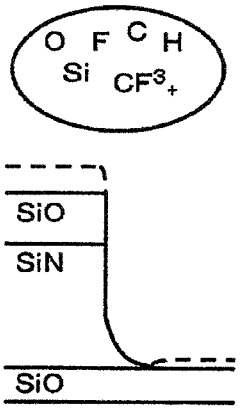
FIG. 4E

PLASMA ETCHING METHOD

BACKGROUND OF THE INVENTION

The present invention relates to a plasma etching method for performing an etching with using plasma.

A silicon oxide film and a silicon nitride film have excellent characteristics for an insulating film. Therefore, the silicon oxide film and the silicon nitride film are used in many processes in manufacturing of a semiconductor device. In a manufacturing process for a semiconductor device, there are many processes for etching a silicon nitride film formed on a silicon oxide film. For example, there is a manufacturing process for a spacer structure arranged on both sides of a gate electrode in formation of a doping layer in a transistor. In the spacer structure, in general, a silicon nitride film is used. The silicon nitride film is formed on a silicon oxide film formed around the gate electrode. The spacer structure is manufactured by etching the silicon nitride film. The silicon oxide film is used as a stopper film in etching the silicon nitride film.

As a technique for increasing an selected etching ratio of such a silicon nitride film, which is formed on the silicon oxide film, to the silicon oxide film, for example, JP-A-10-303187 discloses a technique for etching a silicon nitride film using a fluorocarbon gas such as a $CHF_3$ gas or a $CH_2F_2$ gas as an etching gas.

In the technique disclosed in JP-A-10-303187, the silicon nitride film is etched on the basis of a radical reaction involving a fluorine radical (F*) as main etching species. A fluorocarbon deposited film is deposited on the silicon oxide film. This makes it possible to reduce etching speed and increase the selected etching ratio to the silicon oxide film.

BRIEF SUMMARY OF THE INVENTION

According to the related art, it is possible to increase the selected etching ratio of the silicon nitride film in comparison with the silicon oxide film. However, etching based on an ion/assist reaction mechanism mainly involving $CF_3$ ions as main etching spices progresses for the silicon oxide film as well. Therefore, when high bias is applied to a wafer for the purpose of improvement of the etching speed for the silicon nitride film and shape control in the manufacturing process for the spacer structure, the etching progresses in the silicon oxide film as well and the selection ratio of the silicon nitride film to the silicon oxide film falls.

However, according to the microminiaturization of semiconductor devices in recent years, in the manufacturing process for the spacer structure, a reduction in thickness of the silicon oxide film used as the stopper film for etching of the silicon nitride film is also conspicuous. Therefore, there is a demand for further improvement of the selected ratio of the silicon nitride film in comparison with the silicon oxide film.

In view of such a problem, the present invention provides a plasma etching method that can obtain a selected ratio of a silicon nitride film in comparison with a silicon oxide film requested in etching of the silicon nitride film on the silicon oxide film in manufacturing of a highly microminiaturized semiconductor device.

According to the invention, in a method for selectively etching a first layer in comparison with a second layer, the first layer is etched in an etching (environment) gas comprising gas components respectively identical to second layer components of the second layer so that a third layer formed by the gas components is deposited on the second layer while etching the first layer.

Therefore, according to the invention, the etching ratio on the first layer to be etched in comparison with the etching ratio on the second layer different from the first layer can be improved in comparison with the prior art.

Other objects, features and advantages of the invention will become apparent from the following description of the embodiments of the invention taken in conjunction with the accompanying drawings.

BRIEF DESCRIPTION OF THE SEVERAL VIEWS OF THE DRAWINGS

FIGS. 4A to 4E are diagrams showing etching progress in the example;

DETAILED DESCRIPTION OF THE INVENTION

An embodiment of the present invention is explained below with reference to FIGS. 1 to 6.

Figure 1:
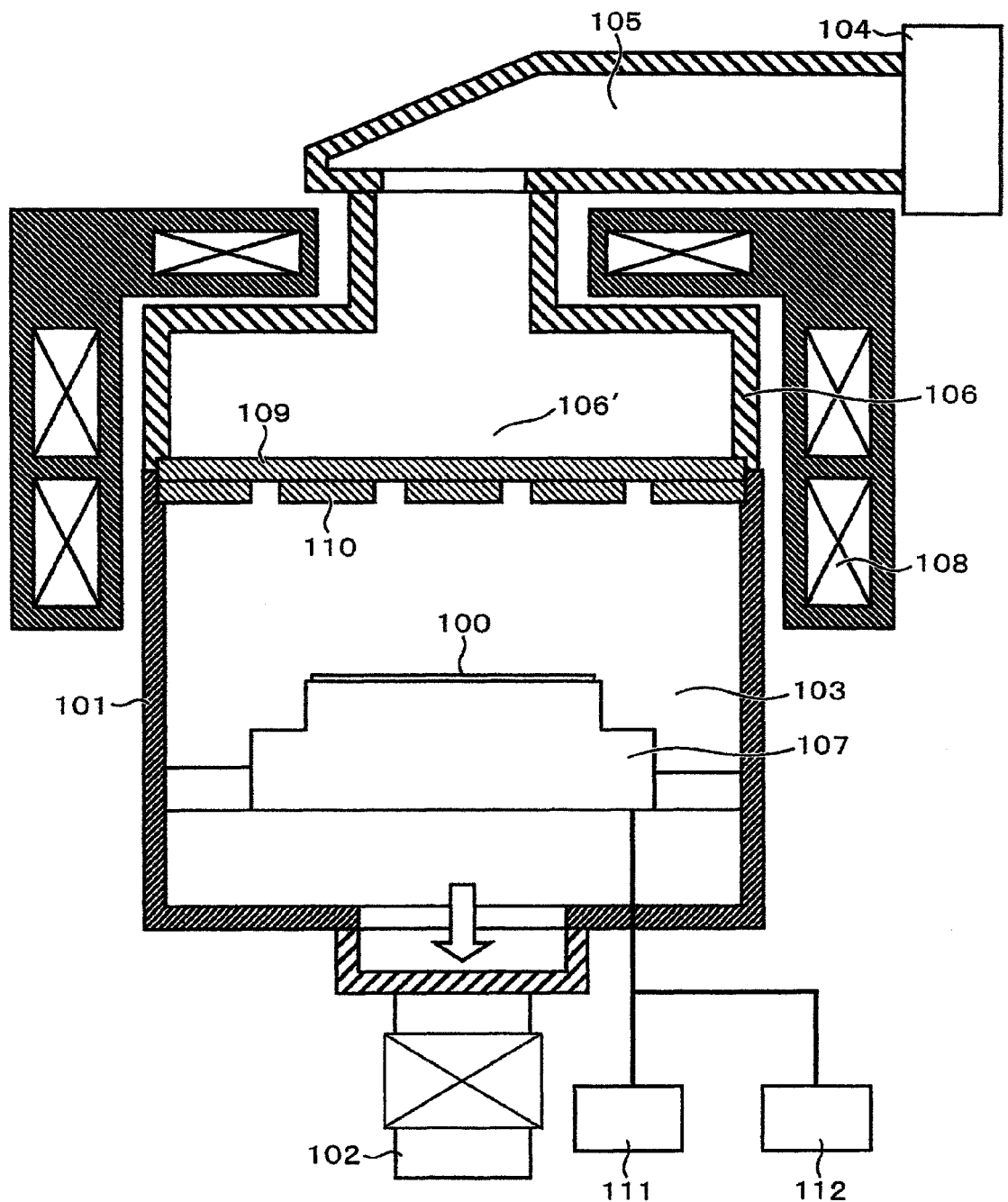
FIG. 1 is a diagram showing the configuration of a microwave plasma etching apparatus applied to the present invention.

FIG. 1 is a longitudinal sectional view of the configuration of a microwave plasma etching apparatus used in this embodiment. In FIG. 1, the plasma etching apparatus includes a vacuum container 101, means for supplying a microwave to the inside of the vacuum container 101, and exhausting means for exhausting the inside of the vacuum container 101.

The vacuum container 101 includes, on the inside thereof, a processing chamber 103 that is a space, on the inner side of which plasma is formed, and in which a specimen 100 serving as a treated target arranged on the inner side is treated by the plasma and a specimen table 107 that is arranged in the processing chamber 103 and on the upper surface of which the specimen 100 is placed and held. The vacuum container 101 has mounted thereon a magnetron power supply 104 that supplies a microwave, a waveguide 105 functioning as a conduit line that propagates the microwave and leads the microwave into the processing chamber 103, and a resonance container 106 that is connected to the waveguide 105. The microwave propagated through the inside of the waveguide 105 is led into the resonance container 106 and resonates in a space on the inside of the resonance container 106.

Further, a solenoid coil 108 that generates a magnetic field in the vacuum container 101 is arranged. The solenoid coil 108 is arranged to surround the outer circumference of an upper part of the vacuum container 101 having a cylindrical shape. The solenoid coil 108 generates the magnetic field with an electric current supplied thereto. In this embodiment, the solenoid coil 108 is arranged in plural stages. A magnetic field having a shape in which an iso-magnetic field is axially symmetric around the center axis in the up down direction and widens downward is led into the inner side of the processing chamber 103.

A vacuum pump 102 such as a turbo molecular pump functioning as exhaust means is arranged below the vacuum container 101. The vacuum pump 102 communicates with a circular opening for exhaust arranged in a lower part of the processing chamber 103 and right under the specimen table 107.

A resonance chamber 106', which is a space for resonance in the resonance container 106, having a cylindrical shape with the axis aligned with the axis of the resonance container 106 is arranged above the processing chamber 103 having the cylindrical shape. A disk-like window member 109 made of a dielectric, which forms the bottom surface of the resonance chamber 106', is arranged between the resonance chamber 106' and the processing chamber 103.

A disk-like shower plate 110 made of a dielectric is arranged spaced apart from and in parallel to the lower surface of the window member 109 under the window member 109. The lower surface of the shower plate 110 forms the ceiling surface of the processing chamber 103.

The shower plate 110 is arranged to be opposed to the upper surface of the specimen table 107. In the center of the shower plate 110, plural through-holes through which gas for wafer treatment is led into the processing chamber 103 from above are arranged. A conduit through which an etching gas supplied from a gas source (not shown), which is set in a building such as a clean room in which the microwave plasma etching apparatus is set, flows communicates with the space between the window member 109 and the shower plate 110. After being led into the space through the conduit, the etching gas flows in the direction of the specimen table 107 below the conduit through the through-holes.

In the specimen table 107, an electrode made of a conductor is arranged. The electrode is electrically connected to a radio-frequency bias power supply 111 that supplies radio-frequency power having a predetermined frequency to the specimen table 107. In a state in which a wafer is placed on a placing surface on the upper surface of the specimen table 107, bias potential is formed on the surface of the wafer by the radio-frequency power supplied from the radio-frequency bias power supply 111. Ions are drawn into the upper surface of the wafer according to a potential difference between the bias potential and the potential of the plasma formed in the processing chamber 103 above the specimen table 107.

Further, a dielectric film (not shown) formed of a material of a dielectric such as $Al_2O_3$ or $Y_2O_3$ forming the placing surface for a specimen is arranged above the specimen table 107. An electrostatic attraction electrode that attracts the wafer onto the surface of the dielectric film with electrostatic force is arranged on the inside of the dielectric film. A DC power supply 112 that supplies DC power to the electrostatic attraction electrode is electrically connected thereto.

In the microwave plasma etching apparatus including the configuration explained above, in a state in which an inert gas such as argon is led into the processing chamber 103 from the gas source and the processing chamber 103 is exhausted by exhausting means to be decompressed, the wafer serving as the specimen 100 is conveyed onto the specimen table 107 through a gate valve (not shown) by conveying means (not shown) such as a robot arm and passed to the specimen table 107.

After being placed on the dielectric film forming the placing surface of the specimen table 107, the wafer serving as the specimen 100 is attracted onto the dielectric film and held thereon when electric power is supplied from the DC power supply 112 to the electrode in the dielectric film and electrostatic force is formed.

The etching gas is led into the processing chamber 103 from the gas source through the through-holes of the shower plate 110. The inside of the processing chamber 103 is adjusted to predetermined pressure through a balance between the lead-in of the etching gas and the exhaust by the vacuum pump 102. The microwave generated from the magnetron power supply 104 propagates through the waveguide 105 and reaches the resonance container 106. An electric field having predetermined intensity is formed in the resonance chamber 106' on the inside of the resonance container 106. The electric field is transmitted through the window member 109 and the shower plate 110 and supplied into the processing chamber 103.

According to an interaction between the magnetic field supplied from the solenoid coil 108 and the microwave supplied from the resonance container 106, the etching gas is excited and converted into plasma. Plasma is formed in the space above the specimen table 107 in the processing chamber 103. Etching is applied to the wafer using the formed plasma.

An example of the present invention in which the microwave plasma etching apparatus is used is explained below.

Under conditions of this example in which etching was performed using a mixed gas containing a $CH_3F$ gas, an $O_2$ gas, and an $SiF_4$ gas shown in Table 1 and conditions in the past, a silicon nitride film and a silicon oxide film were etched and etching election ratios of the silicon nitride film to the silicon oxide film were compared and examined. A result of the comparison and examination is shown in FIG. 2.

TABLE 1

| | |
|---|---|
| $CH_3F$ gas | 50 sccm |
| $O_2$ gas | 20 sccm |
| $SiF_4$ gas | 5 sccm |
| Gas pressure | 0.5 Pa |
| Microwave power source power | 1400 W |
| Bias power source power | 40 W |

Figure 2:
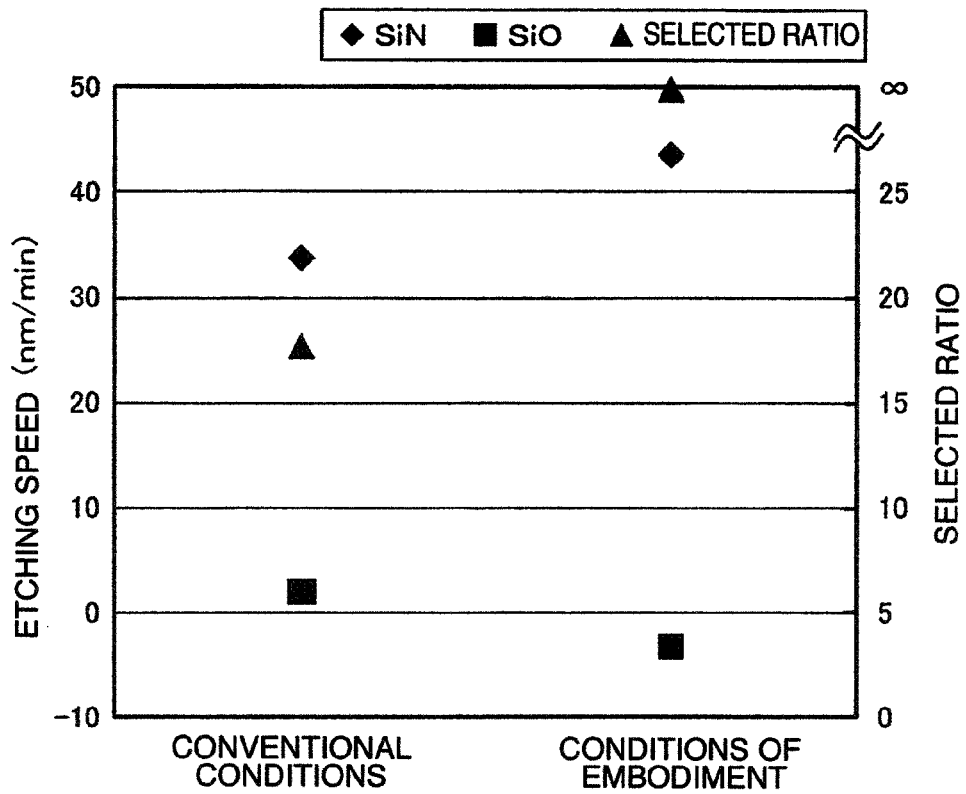
FIG. 2 is a graph showing a result obtained by comparing selected etching ratios of a silicon nitride film to a silicon oxide film under conditions of an example of the present invention and under conditions in the past.

As shown in FIG. 2, under the conditions in the past, the selected etching ratio of the silicon nitride film to the silicon oxide film indicates a high value of about 17. However, since etching speed for the silicon oxide film is positive, etching of the silicon oxide film progresses.

On the other hand, under the conditions of this example, the etching speed for the silicon nitride film increases to be higher than that under the conditions in the past. The etching speed of the silicon oxide film is a negative value. This indicates that a deposit is formed on the silicon oxide film. Therefore, under the conditions of this example, the selected etching ratio of the silicon nitride film to the silicon oxide film is infinite.

As explained above, in this example, the selected etching ratio of the silicon nitride film to the silicon oxide film has been able to be substantially improved than that under the conditions in the past. In other words, it is possible to obtain a selection ratio of the silicon nitride film to the silicon oxide film required in etching of the silicon nitride film on the silicon oxide film for manufacturing of a highly microminiaturized semiconductor device.

The selected etching ratio of the silicon nitride film to the silicon oxide film means a value obtained by dividing the etching speed for the silicon nitride film by the etching speed for the silicon oxide film.

Figure 3:
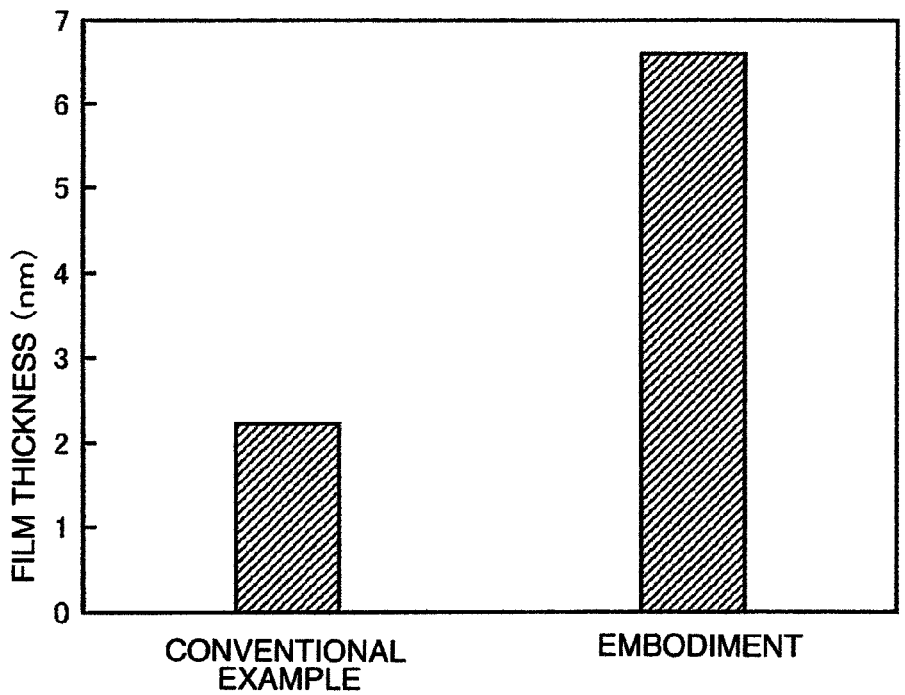
FIG. 3 is a graph showing an analysis result obtained using X-ray photoelectron spectroscopy.

To check a mechanism of the improvement of the selected etching ratio of the silicon nitride film to the silicon oxide film according to this example, the surface of a silicon wafer after treatment under the conditions of this example and the conditions in the past was analyzed using X-ray photoelectron spectroscopy (hereinafter referred to as XPS). An analysis result is shown in FIG. 3.

Under both the conditions of this example and the conditions in the past, a deposit was formed on the surface of the silicon wafer. When the deposit was analyzed by the XPS, as shown in FIG. 3, it was able to be confirmed that the thickness of the deposit was 6.6 nm under the conditions of this example, which was about three times as large as the thickness of the deposit of 2.2 nm under the conditions in the past. It was able to be confirmed that, under the conditions of this example, compared with the conditions in the past, more Si—O bonding was included in the deposit. According to this analysis result, it is considered that the selection ratio was improved because the deposit including the more Si—O bonding was deposited on the silicon oxide film.

Based on the analysis result of the XPS, a mechanism for the substantial improvement of the selected etching ratio of the silicon nitride film to the silicon oxide film by the deposit including the more Si—O bonding is considered as explained below.

FIGS. 4A to 4E are diagrams showing the progress of etching under the conditions of this example applied to a wafer in which a base film was the silicon oxide film, a mask was the silicon oxide film, and a film to be etched was the silicon nitride film.

FIG. 4A shows the progress immediately after occurrence of plasma. The etching of the wafer is performed mainly by an ion/assist reaction with radicals and ions generated by the plasma. The $SiF_4$ gas and the $O_2$ gas are dissociated from each other by the plasma, whereby Si and O are generated in the plasma. As shown in FIG. 4B, the Si and O adhere to the surface of the mask of the silicon oxide film as a deposited film of Si—O bonding.

On the other hand, on the surface of the silicon nitride film, since the O combines with N of the silicon nitride film and changes to NOx having high volatility before Si—O bonding of the Si and O, the deposited film of the Si—O bonding is less easily generated on the surface of the silicon nitride film. This is because, since bonding energy (150 Kcal/mol) of N—O bonding is higher than bonding energy (105 Kcal/mol) of Si—N bonding, when the O adheres to the surface of the silicon nitride film, N of the silicon nitride film is easily extracted.

Therefore, as shown in FIG. 4C, the mask of the silicon oxide film is not etched and etching of only the silicon nitride film progresses.

When the silicon nitride film is removed by the etching, the silicon oxide film serving as the base film is exposed. However, as shown in FIG. 4D, on the surface of the silicon oxide film serving as the base film, as on the surface of the mask of the silicon oxide film, the Si and O in the plasma adhere as the deposited film of the Si—O bonding.

At this point, since an etching shape of the silicon nitride film is a taper shape, additional etching for changing the etching shape to a vertical shape is necessary. However, since the deposited film of the Si—O bonding is generated on the surface of the silicon oxide film serving as the base film, the silicon oxide film serving as the base film is not etched.

Therefore, as shown in FIG. 4E, the vertical shape can be obtained without damaging the silicon oxide film serving as the base film.

Subsequently, dependency of a flow rate of the $SiF_4$ gas to the mixed gas containing the $CH_3F$ gas and the $O_2$ gas at the selected etching ratio of the silicon nitride film to the silicon oxide film was checked. A result of the check of the dependency is shown in FIG. 5.

Figure 5:
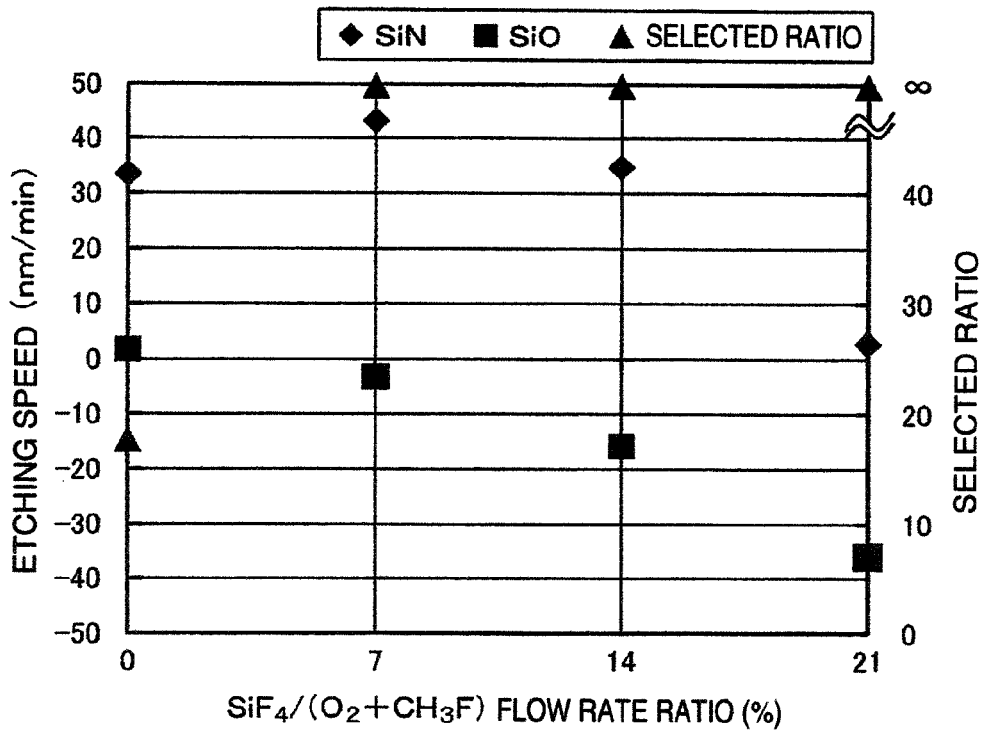
FIG. 5 is a graph showing dependency of an $SiF_4$ gas flow rate on a mixed gas containing a $CH_3F$ gas and an $O_2$ gas in an selected etching ratio of the silicon nitride film to the silicon oxide film.

As shown in FIG. 5, when the $SiF_4$ gas is added, the etching speed for the silicon nitride film increases and the etching speed for the silicon oxide film is changed to negative. The etching does not progress. The etching speed for the silicon nitride film is maximized near a point where a flow ratio of the $SiF_4$ gas to the mixed gas containing the $CH_3F$ gas and the $O_2$ gas is near 7%. When the flow ratio increases to be equal to or higher than 7%, the etching speed decreases.

When the flow ratio exceeds 20%, the etching speed for the silicon nitride film decreases to about 3.0 nm/min. When the flow ratio further increases, the silicon nitride film changes to an etch-stop state in which etching of the silicon nitride film does not progress. Therefore, the $SiF_4$ gas is desirably used at a flow ratio equal to or lower than 20% to the mixed gas containing the $CH_3F$ gas and the $O_2$ gas.

Subsequently, dependency of the flow rate of the $O_2$ gas on the mixed gas containing the $CH_3F$ gas and the $SiF_4$ gas at the selected etching ratio of the silicon nitride film to the silicon oxide film was checked. A result of the checking of the dependency is shown in FIG. 6.

Figure 6:
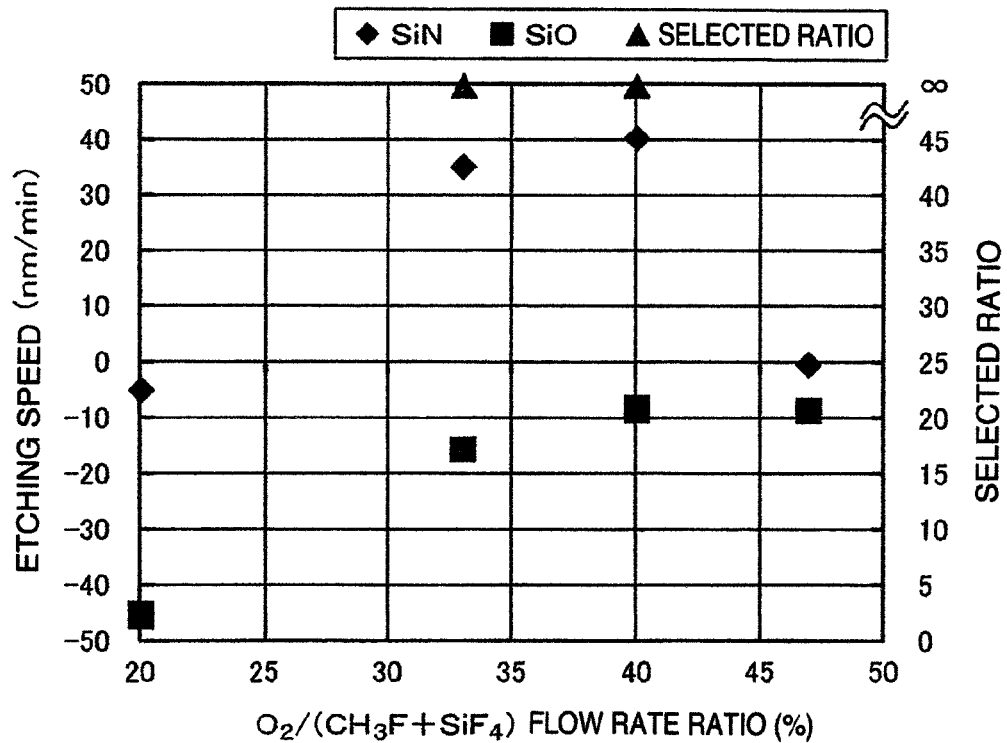
FIG. 6 is a graph showing dependency of an $O_2$ gas flow rate on a mixed gas containing a $CH_3F$ gas and an $SiF_4$ gas in the selected etching ratio of the silicon nitride film to the silicon oxide film.

As shown in FIG. 6, irrespective of the flow ratio of the $O_2$ gas to the mixed gas containing the $CH_3F$ gas and the $SiF_4$ gas, the etching speed for the silicon oxide film is a negative value. Therefore, it is seen that etching of the silicon oxide film does not progress.

On the other hand, the etching speed for the silicon nitride film substantially changes depending on the flow ratio of the $O_2$ gas. In a region where the flow ratio of the $O_2$ gas is equal to or lower than 25% and a region where the flow ratio of the $O_2$ gas is equal to or higher than 45%, etching of the silicon nitride film is stopped. Therefore, the silicon nitride film is desirably used in the region where the flow ratio of the $O_2$ gas is between 25% and 45%.

Since the etching speed for the silicon nitride film substantially changes according to the flow ratio of the $O_2$ gas, it is possible to control the etching speed for the silicon nitride film to desired etching speed by appropriately setting the flow ratio of the $O_2$ gas.

According to the microminiaturization of semiconductor devices in recent years, the silicon nitride film to be etched in this embodiment is also reduced in thickness. When such a thin film is etched, it is easy to control an etching amount by reducing the etching speed for the silicon nitride film. In this embodiment, as explained above, the etching speed for the silicon nitride film can be controlled to desired etching speed according to the flow ratio of the $O_2$ gas. Therefore, this embodiment is effective for the etching explained above as well.

In this embodiment, the mixed gas containing the $CH_3F$ gas, the $O_2$ gas, and the $SiF_4$ gas is used. However, an effect same as the effect in this embodiment can be obtained even if a fluorocarbon gas and an oxygen containing gas are respectively used as the $CH_3F$ gas and the $O_2$ gas. As the fluorocarbon gas, at least one gas among the $CH_3F$ gas, a $CH_2F_2$ gas, and a $CHF_3$ gas can be used.

As the oxygen containing gas, at least one gas among the $O_2$ gas, a CO gas, and a $CO_2$ gas can be used. Further, an inert gas may be added to a mixed gas containing the fluorocarbon gas, the oxygen containing gas, and the $SiF_4$ gas. As the inert gas, at least one gas among an He gas, an Ne gas, an Ar gas, an Xe gas, and a Kr gas can be use.

An effect same as the effect in this embodiment can be obtained even if a mixed gas containing a $CH_4$ gas and a fluorine containing gas is used as an alternative gas for the fluorocarbon gas. As the fluorine containing gas, at least one gas of an $SF_6$ gas and the $CF_4$ gas can be used.

In this embodiment, the film to be etched is the silicon nitride film. However, an effect same as the effect in this embodiment can be obtained even if a silicon nitride oxide film (SiON film) or a silicon nitride carbide oxide film (SiOCN film) is used as the film to be etched. An effect same as the effect in this embodiment can be obtained even if a silicon carbide film (SiC film) or a silicon carbide oxide film (SiOC film) is used as the film to be etched. In the case of the silicon carbide film (SiC film) and the silicon carbide oxide film (SiOC film), O generated by dissociation of the $O_2$ gas during etching and C in the film to be etched combine with each other and COx having high volatility is generated. Therefore, it is possible to improve an selected etching ratio of the film to be etched to the silicon oxide film.

In this embodiment, the application example in the microwave plasma etching apparatus of the ECR (Electron Cyclotron Resonance) system employing the microwave is explained. However, the present invention is not limited to this. The present invention may be applied to a plasma etching apparatus including plasma generating means of a capacitive coupling type or an inductive coupling type.

As explained above, the present invention is a plasma etching method for etching, using gas that can generate a deposited film containing components same as components of a film different from a film to be etched, a film to be etched in which generation of a deposited film is suppressed. Therefore, according to the present invention, it is possible to substantially improve an selected etching ratio of the film to be etched, in which generation of the deposited film is suppressed, to the film different from the film to be etched than that in the related art.

As another embodiment of the present invention, in etching of a polysilicon film in which a metal electrode material is used as a base film, for example, when a TaN film or a WN film is used as the base film, a deposited film containing Ta or W is formed on the TaN film or the WN film by etching the polysilicon film using a $TaF_5$ gas or a $WF_6$ gas. Therefore, it is possible to substantially improve an selected etching ratio of the polysilicon film to the TaN film or the WN film than that in the related art.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method for selectively etching a silicon nitride layer in comparison with a silicon oxide layer, wherein the silicon nitride layer is etched using a mixed gas comprising a fluorocarbon gas, a gas including oxygen and a $SiF_4$ gas.

2. The method according to claim 1, wherein the mixed gas further comprises an inert gas.

3. The method according to claim 1, wherein the fluorocarbon gas includes a $CH_3F$ gas, and the gas including oxygen includes an $O_2$ gas.

4. A method for selectively etching a silicon nitride layer in comparison with a silicon oxide layer, wherein the silicon nitride layer is etched using a mixed gas comprising a $CH_4$ gas, a gas including fluorine, a gas including oxygen and a $SiF_4$ gas.

* * * * *